United States Patent
Jiang

(10) Patent No.: US 10,250,153 B2
(45) Date of Patent: *Apr. 2, 2019

(54) DATA PROCESSING DEVICE FOR HIGH VOLTAGE DIRECT CURRENT TRANSMISSION SYSTEM AND METHOD THEREOF

(71) Applicant: LSIS CO., LTD., Anyang-si, Gyeonggi-do (KR)

(72) Inventor: Li Li Jiang, Suwon-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 322 days.

This patent is subject to a terminal disclaimer.

(21) Appl. No.: 14/697,422

(22) Filed: Apr. 27, 2015

(65) Prior Publication Data

US 2015/0381069 A1   Dec. 31, 2015

(30) Foreign Application Priority Data

May 14, 2014 (KR) ........................ 10-2014-0058071

(51) Int. Cl.
| | |
|---|---|
| G01R 21/06 | (2006.01) |
| H02M 5/42 | (2006.01) |
| G08C 23/06 | (2006.01) |
| H04Q 9/00 | (2006.01) |
| G01R 19/252 | (2006.01) |
| H04J 14/02 | (2006.01) |
| G01R 19/25 | (2006.01) |

(52) U.S. Cl.
CPC ............ *H02M 5/42* (2013.01); *G01R 19/252* (2013.01); *G08C 23/06* (2013.01); *H04J 14/02* (2013.01); *H04Q 9/00* (2013.01); *G01R 19/2513* (2013.01)

(58) Field of Classification Search
CPC ... H02M 5/42; G01R 19/252; G01R 19/2513; G08C 23/06; H04Q 9/00; H04R 14/02
USPC .......................................................... 702/62
See application file for complete search history.

(56) References Cited

U.S. PATENT DOCUMENTS

| 5,182,667 A | 1/1993 | Shibata et al. |
| 8,886,476 B1 * | 11/2014 | Taft ................ H04B 3/542 |
| | | 700/286 |
| 2002/0130641 A1 | 9/2002 | Schofield |

FOREIGN PATENT DOCUMENTS

| CN | 1881744 | 12/2006 |
| CN | 101194455 A | 6/2008 |
| CN | 103731209 | 4/2014 |
| GB | 2500717 | 10/2013 |

(Continued)

OTHER PUBLICATIONS

Japan Patent Office Application Serial No. 2015-098721, Office Action dated May 24, 2016, 1 page.

(Continued)

*Primary Examiner* — Huan Hoang
(74) *Attorney, Agent, or Firm* — K&L Gates LLP

(57) ABSTRACT

Provided is a data processing device of a high voltage direct current (HVDC) transmission system including: a measuring module measuring voltage and current at one or more points in the HVDC transmission system; a data processing part generating measured data units by using the measured values received from the measuring module; and a communication module transmitting the plurality of measured data units to the outside by using a wavelength division multiplexing method.

3 Claims, 10 Drawing Sheets

(56) References Cited

FOREIGN PATENT DOCUMENTS

| JP | 4-25243 | 1/1992 |
|----|---------|--------|
| KR | 10-2001-0112222 | 12/2001 |
| KR | 10-2006-0083367 | 7/2006 |
| KR | 10-2012-0127531 | 11/2012 |
| KR | 20130035739 A | 4/2013 |
| KR | 20130115776 | 10/2013 |
| KR | 10-2014-0032494 | 3/2014 |
| KR | 10-2014-0032567 | 3/2014 |

OTHER PUBLICATIONS

State Intellectual Property Office of the People's Republic of China Application Serial No. 201510246941.8, Office Action dated Jan. 17, 2017, 8 pages.
Korean Intellectual Property Office Application Serial No. 10-2014-0058071, Office Action dated Nov. 20, 2015, 4 pages.
European Patent Office Application Serial No. 15165668.3, Search Report dated Oct. 23, 2015, 7 pages.
Chinese Notice of Allowance dated Oct. 29, 2018 in related Chinese Application No. 201510246941.8; (4 Pages).

* cited by examiner

CONFIGURATION OF MEASURED DATA PACKET

DATA PROCESSING DEVICE FOR HIGH VOLTAGE DIRECT CURRENT TRANSMISSION SYSTEM AND METHOD THEREOF

CROSS-REFERENCE TO RELATED APPLICATIONS

Pursuant to 35 U.S.C. § 119(a), this application claims the benefit of earlier filing date and right of priority to Korean Patent Application No. 10-2014-0058071, filed on May 14, 2014, the contents of which are hereby incorporated by reference herein in its entirety.

BACKGROUND

The present disclosure relates to a data processing device for a high voltage direct current transmission system and a method thereof.

A high voltage direct current (HVDC) transmission system refers to an electric power transmission method in which alternating current (AC) power generated from a power plant is converted into direct current (DC) power and transmitted by a transmission substation, and the transmitted DC power is converted again into AC power in a receiving substation to supply the power.

The HVDC transmission system is applied to submarine cable transmission, long distance bulk transmission, interconnection between AC systems, and the like. Also, the HVDC transmission system enables interconnection between systems having different frequencies and asynchronous interconnection.

The transmission substation converts AC power into DC power. That is, since the situation in which AC power is transmitted by using submarine cables and the like is very dangerous, the transmission substation converts the AC power into the DC power and then transmits the DC power to a receiving substation.

Such a HDVC transmission system controls the system by using measured voltage/current values at one or more points therein.

Typical HDVC transmission systems transmit the data of the measured values through a time division multiplexing (TDM) method. When the HDVC transmission system transmits the measured data in series through the TDM method, the number of optical cables may be minimized, but the TDM method has a limitation in that it is sensitive to transmission synchronization.

Also, when the measured data is transmitted through the TDM method, the bottleneck ratio of a channel increases as the number of measuring modules increases.

SUMMARY

Embodiments provide a data processing device of a high voltage direct current (HVDC) transmission system which is not sensitive to transmission synchronization.

Embodiments also provide a data processing device of a HDVC transmission system which is capable of satisfying system requirements even if the number of measuring modules (or data unit generating parts) because the measured data is transmitted in parallel through a wavelength division multiplexing method.

Embodiments also provide a data processing device of a HDVC transmission system in which the number of cable wiring decreases and a system structure is simplified.

In one embodiment, a data processing device of a high voltage direct current (HVDC) transmission system includes: a measuring module measuring voltage and current at one or more points in the HVDC transmission system; a data processing part generating measured data units by using the measured values received from the measuring module; and a communication module transmitting the plurality of measured data units to the outside by using a wavelength division multiplexing method.

The data processing part may include a plurality of data unit generating parts, and each of the plurality of data unit generating parts may generate the measured data unit by using the measured values received from the measuring unit and transfer the generated measured data unit to the communication module.

The communication module may transmit, in parallel, the plurality of measured data units through one optical fiber.

The communication module may transmit the plurality of measured data units by respectively assigning a plurality of wavelength bands to the plurality of measured data units.

The data processing device may further include a control part which codes the plurality of measured data units to transfer to the outside.

The plurality of data unit generating parts each may preprocess the measured values measured at the measuring part to generate a preprocessed measured data unit.

The details of one or more embodiments are set forth in the accompanying drawings and the description below. Other features will be apparent from the description and drawings, and from the claims.

DETAILED DESCRIPTION OF THE EMBODIMENTS

Hereinafter, exemplary embodiments will be described in more detail with reference to the accompanying drawings. The suffixes "part", "module" and "unit" used to signify components are used interchangeably herein to aid in the writing of specification, and thus they should not be considered as having specific meanings or roles.

Figure 1:
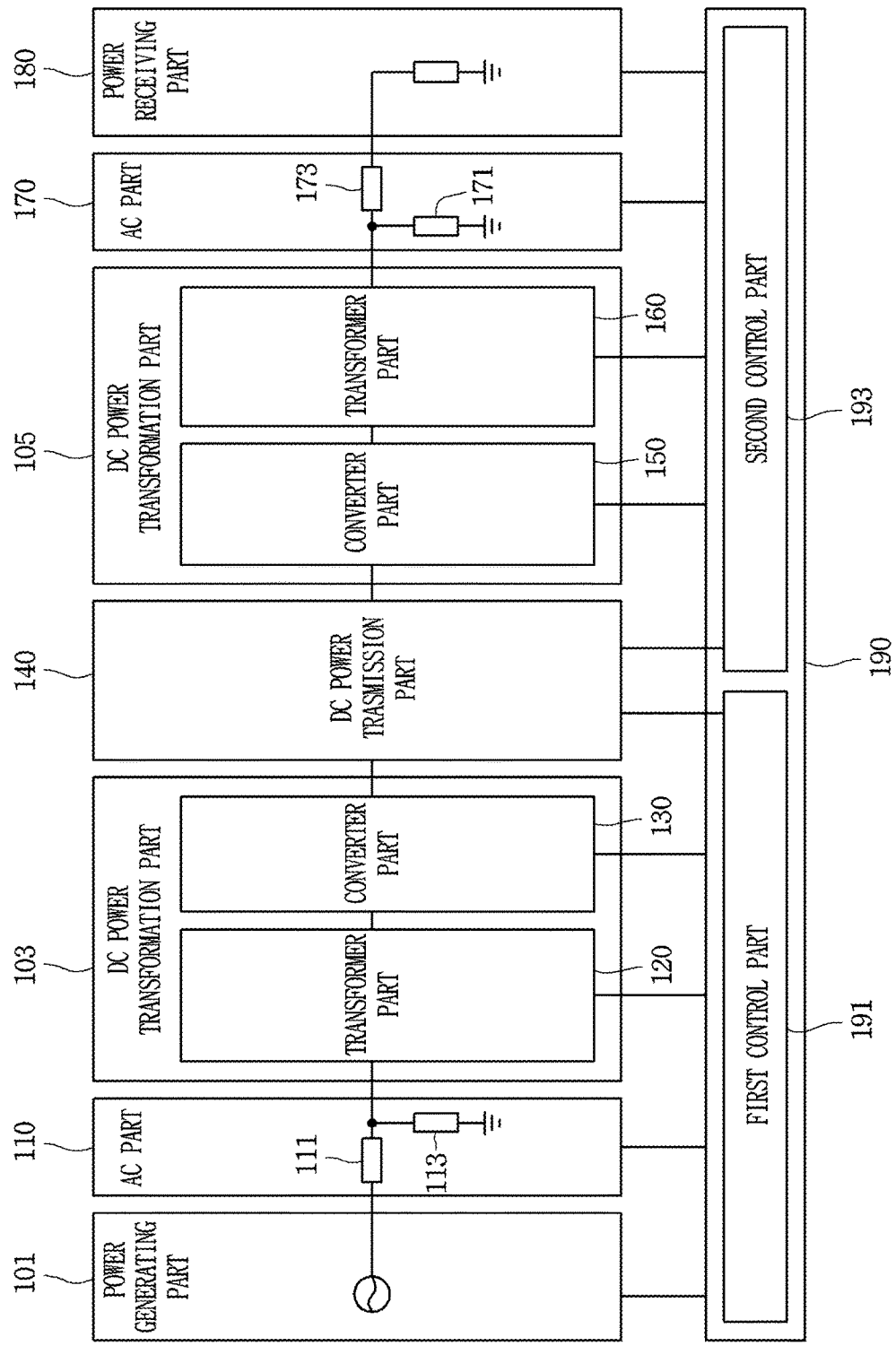
FIG. 1 illustrates a high voltage direct current (HVDC) transmission system according to an embodiment.

FIG. 1 illustrates a high voltage direct current (HVDC) transmission system according to an embodiment.

As illustrated in FIG. 1, a HVDC transmission system 100 according to an embodiment includes a power generating part 101, a transmission side alternating current (AC) part 110, a transmission side power transformation part 103, a direct current (DC) power transmission part 140, a customer side power transformation part 105, a customer side AC part 170, a customer part 180, and a control part 190. The transmission side power transformation part 103 includes a transmission side transformer part 120, and a transmission side AC-DC converter part 130. The customer side power transformation part 105 includes a customer side DC-AC converter part 150, and a customer side transformer part 160.

The power generating part 101 generates three-phase AC power. The power generating part 101 may include a plurality of power generating plants.

The transmission side AC part 110 transmits the three-phase AC power generated by the power generating part 101 to a DC power transformation substation including the transmission side transformer part 120 and the transmission side AC-DC converter part 130.

The transmission side transformer part 120 isolates the transmission side AC part 110 from the transmission side AC-DC converter part 130 and the DC power transmission part 140.

The transmission side AC-DC converter part 130 converts, to DC power, the three-phase AC power corresponding to the output of the transmission side transformer part 120.

The DC power transmission part 140 transfers the transmission side DC power to the customer side.

The customer side DC-AC converter part 150 converts the DC power transferred by the DC power transmission part 140 into AC power.

The customer side transformer part 160 isolates the customer side AC part 170 from the customer side DC-AC converter part 150 and the DC power transmission part 140.

The customer side AC part 170 provides the customer part 180 with three-phase AC power corresponding to the output of the customer side transformer part 160.

The control part 190 controls at least one of the power generating part 101, the transmission side AC part 110, the transmission side power transformation part 103, the DC power transmission part 140, the customer side power transformation part 105, the customer side AC part 170, the customer part 180, the control part 190, the transmission side AC-DC converter part 130, and the customer side DC-AC converter part 150. Particularly, the control part 190 may control the turn-on and turn-off timings of a plurality of valves which are provided in the transmission side AC-DC converter part 130 and the customer side DC-AC converter part 150. Here, the valve may be a thyristor or an insulated gate bipolar transistor (IGBT).

Figure 2:
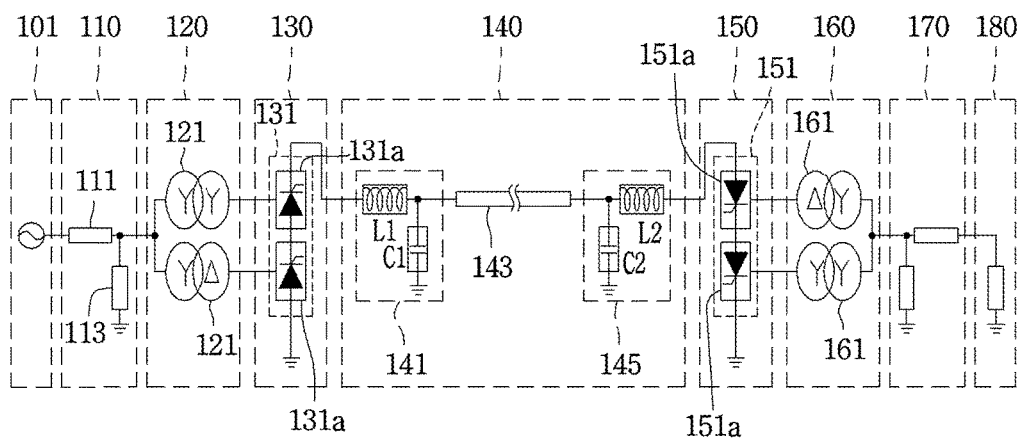
FIG. 2 illustrates a monopolar type HVDC transmission system according to an embodiment.

FIG. 2 illustrates a monopolar type HVDC transmission system according to an embodiment.

Particularly, FIG. 2 illustrates a system which transmits DC power with a single pole. Hereinafter, the single pole is described assuming a positive pole, but is not necessarily limited thereto.

The transmission side AC part 110 includes an AC transmission line 111 and an AC filter 113.

The AC power transmission line 111 transfers the three-phase AC power generated by the power generating part 101 to the transmission side power transformation part 103.

The AC filter 113 removes frequency components other than the frequency component used by the power transformation part 103 from the transferred three-phase AC power.

The transmission side transformer part 120 includes one or more transformers 121 for the positive pole. For the positive pole, the transmission side AC-DC converter part 130 includes an AC-positive pole DC converter 131, and the AC-positive pole DC converter 131 includes one or more three-phase valve bridges 131a respectively corresponding to the one or more transformers 121.

When one three-phase valve bridge 131a is used, the AC-positive pole DC converter 131 may generate positive pole DC power having six pulses by using the AC power. Here, a primary coil and a secondary coil of one of the transformers 121 may have a Y-Y connection or a Y-delta (Δ) connection.

When two three-phase valve bridges 131a are used, the AC-positive pole DC converter 131 may generate positive pole DC power having 12 pulses by using the AC power. Here, a primary coil and a secondary coil of one of the two transformers 121 may have a Y-Y connection, and a primary coil and a secondary coil of the other of the two transformers 121 may have a Y-Δ connection.

When three valve bridges 131a are used, the AC-positive pole DC converter 131 may generate positive pole DC power having 18 pulses by using the AC power. The more the number of the pulses of the positive pole DC power becomes, the lower the price of the filter becomes.

The DC power transmission part 140 includes a transmission side positive pole DC filter 141, a positive pole DC power transmission line 143, and a customer side positive pole DC filter 145.

The transmission side positive pole DC filter 141 includes an inductor L1 and a capacitor C1 and performs DC filtering on the positive pole DC power output by the AC-positive pole DC converter 131.

The positive pole DC power transmission line 143 has a single DC line for transmission of the positive pole DC power, and the earth may be used as a current feedback path. One or more switches may be disposed on the DC line.

The customer side positive pole DC filter 145 includes an inductor L2 and a capacitor C2 and performs DC filtering on the positive pole DC power transferred through the positive pole DC power transmission line 143.

The customer side DC-AC converter part 150 includes a positive pole DC-AC converter 151 and the positive pole DC-AC converter 151 includes one or more three-phase valves 151a.

The customer side transformer part 160 includes, for the positive pole, one or more transformers 161 respectively corresponding to one or more three-phase valve bridges 151a.

When one three-phase valve bridge 151a is used, the positive pole DC-AC converter 151 may generate AC power having six pulses by using the positive pole DC power. Here, a primary coil and a secondary coil of one of the transformers 161 may have a Y-Y connection or a Y-delta (Δ) connection.

When two three-phase valve bridges 151a are used, the positive pole DC-AC converter 151 may generate AC power having 12 pulses by using the positive pole DC power. Here, a primary coil and a secondary coil of one of the two transformers 161 may have a Y-Y connection, and a primary coil and a secondary coil of the other of the two transformers 161 may have a Y-Δ connection.

When three three-phase valve bridges 151a are used, the positive pole DC-AC converter 151 may generate AC power having 18 pulses by using the positive pole DC power. The more the number of the pulses of the AC power become, the lower the price of the filter becomes.

The customer side AC part 170 includes an AC filter 171 and an AC power transmission line 173.

The AC filter 171 removes frequency components other than the frequency component (for example, 60 Hz) used by the customer part 180, from the AC power generated by the customer side power transformation part 105.

The AC power transmission line 173 transfers the filtered AC power to the customer part 180.

Figure 3:
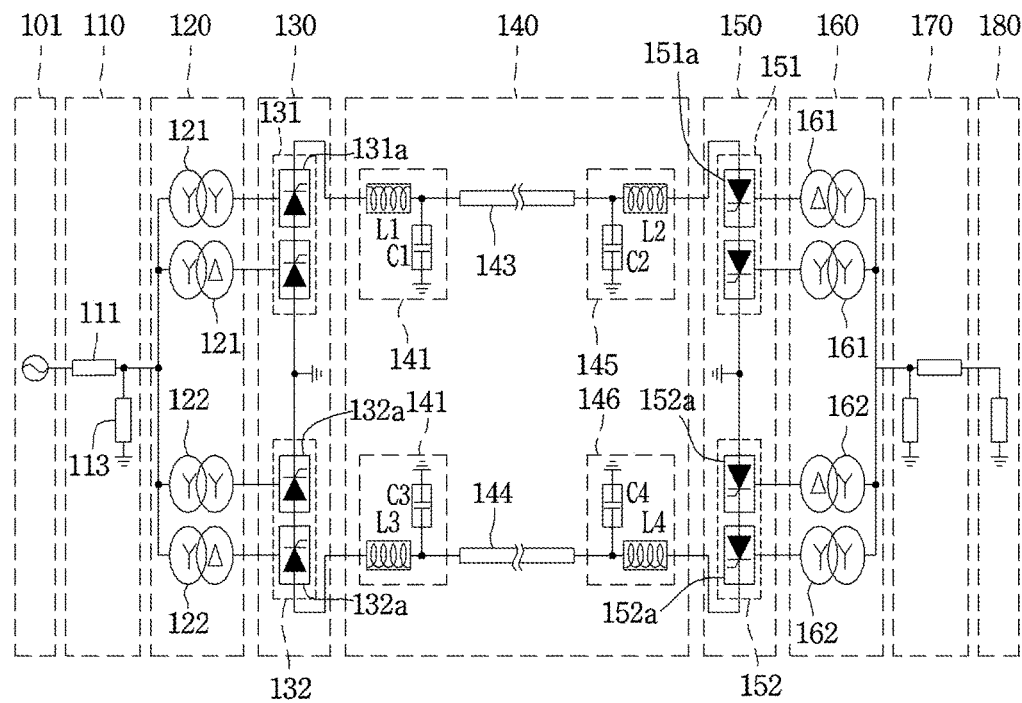
FIG. 3 illustrates a bipolar type HVDC transmission system according to an embodiment.

FIG. 3 illustrates a bipolar type HVDC transmission system according to an embodiment.

Particularly, FIG. 3 illustrates a system which transmits DC power with two poles. Hereinafter, the two poles are described assuming a positive pole and a negative pole, but are not necessarily limited thereto.

The transmission side AC part 110 includes an AC transmission line 111 and an AC filter 113.

The AC power transmission line 111 transfers the three-phase AC power generated by the power generating part 101 to the transmission side power transformation part 103.

The AC filter 113 removes frequency components other than the frequency component used by the power transformation part 103 from the transferred three-phase AC power.

The transmission side transformer part 120 includes one or more transformers 121 for the positive pole, and one or more transformers 122 for the negative pole. The transmission side AC-DC converter part 130 includes an AC-positive pole DC converter 131 which generates positive pole DC power and an AC-negative pole DC converter 132 which generates negative pole DC power. The AC-positive pole DC converter 131 includes one or more three-phase valve bridges 131a respectively corresponding to the one or more transformers 121 for the positive pole. The AC-negative pole DC converter 132 includes one or more three-phase valve bridges 132a respectively corresponding to the one or more transformers 122 for the negative pole.

When one three-phase valve bridge 131a is used for the positive pole, the AC-positive pole DC converter 131 may generate positive pole DC power having six pulses by using the AC power. Here, a primary coil and a secondary coil of one of the transformers 121 may have a Y-Y connection or a Y-delta (Δ) connection.

When two three-phase valve bridges 131a are used for the positive pole, the AC-positive pole DC converter 131 may generate positive pole DC power having 12 pulses by using the AC power. Here, a primary coil and a secondary coil of one of the two transformers 121 may have a Y-Y connection, and a primary coil and a secondary coil of the other of the two transformers 121 may have a Y-Δ connection.

When three three-phase valve bridges 131a are used for the positive pole, the AC-positive pole DC converter 131 may generate positive pole DC power having 18 pulses by using the AC power. The more the number of the pulses of the positive pole DC power becomes, the lower the price of the filter becomes.

When one three-phase valve bridge 132a is used for the negative pole, the AC-negative pole DC converter 132 may generate negative pole DC power having six pulses. Here, a primary coil and a secondary coil of one of the transformers 122 may have a Y-Y connection or a Y-delta (Δ) connection.

When two three-phase valve bridges 132a are used for the negative pole, the AC-negative pole DC converter 132 may generate negative pole DC power having 12 pulses. Here, a primary coil and a secondary coil of one of the two transformers 122 may have a Y-Y connection, and a primary coil and a secondary coil of the other of the two transformers 122 may have a Y-Δ connection.

When three three-phase valve bridges 132a are used for the negative pole, the AC-negative pole DC converter 132 may generate negative pole DC power having 18 pulses. The more the number of the pulses of the negative pole DC power becomes, the lower the price of the filter becomes.

The DC power transmission part 140 includes a transmission side positive pole DC filter 141, a transmission side negative pole DC filter 142, a positive pole DC power transmission line 143, a negative pole DC power transmission line 144, a customer side positive pole DC filter 145, and a customer side negative pole DC filter 146.

The transmission side positive pole DC filter 141 includes an inductor L1 and a capacitor C1 and performs DC filtering on the positive pole DC power output by the AC-positive pole DC converter 131.

The transmission side negative pole DC filter 142 includes an inductor L3 and a capacitor C3 and performs DC filtering on the negative pole DC power output by the AC-negative pole DC converter 132.

The positive pole DC power transmission line 143 has a single DC line for transmission of the positive pole DC power, and the earth may be used as a current feedback path. One or more switches may be disposed on the DC line.

The negative pole DC power transmission line 144 has a single DC line for transmission of the negative pole DC power, and the earth may be used as a current feedback path. One or more switches may be disposed on the DC line.

The customer side positive pole DC filter 145 includes an inductor L2 and a capacitor C2 and performs DC filtering on the positive pole DC power transferred through the positive pole DC power transmission line 143.

The customer side negative pole DC filter 146 includes an inductor L4 and a capacitor C4 and performs DC filtering on the negative pole DC power transferred through the negative pole DC power transmission line 144.

The customer side DC-AC converter part 150 includes a positive pole DC-AC converter 151 and a negative pole DC-AC converter 152. The positive pole DC-AC converter 151 includes one or more three-phase valve bridges 151a and the negative pole DC-AC converter 152 includes one or more three-phase valve bridges 152a.

The customer side transformer part 160 includes, for the positive pole, one or more transformers 161 respectively corresponding to one or more three-phase valve bridges 151a, and for the negative pole, one or more transformers 162 respectively corresponding to one or more three-phase valve bridges 152a.

When one three-phase valve bridge 151a is used for the positive pole, the positive pole DC-AC converter 151 may generate AC power having six pulses by using the positive pole DC power. Here, a primary coil and a secondary coil of one of the transformers 161 may have a Y-Y connection or a Y-delta (Δ) connection.

When two three-phase valve bridges 151*a* are used for the positive pole, the positive pole DC-AC converter 151 may generate AC power having 12 pulses by using the positive pole DC power. Here, a primary coil and a secondary coil of one of the two transformers 161 may have a Y-Y connection, and a primary coil and a secondary coil of the other of the two transformers 161 may have a Y-Δ connection.

When three three-phase valve bridges 151*a* are used for the positive pole, the positive pole DC-AC converter 151 may generate AC power having 18 pulses by using the positive pole DC power. The more the number of the pulses of the AC power become, the lower the price of the filter becomes.

When one three-phase valve bridge 152*a* is used for the negative pole, the negative pole DC-AC converter 152 may generate AC power having six pulses by using the negative pole DC power. Here, a primary coil and a secondary coil of one of the transformers 162 may have a Y-Y connection or a Y-delta (Δ) connection.

When two three-phase valve bridges 152*a* are used for the negative pole, the negative pole DC-AC converter 152 may generate AC power having 12 pulses by using the negative pole DC power. Here, a primary coil and a secondary coil of one of the two transformers 162 may have a Y-Y connection, and a primary coil and a secondary coil of the other of the two transformers 162 may have a Y-Δ connection.

When three three-phase valve bridges 152*a* are used for the negative pole, the negative pole DC-AC converter 152 may generate AC power having 18 pulses by using the negative pole DC power. The more the number of the pulses of the AC power become, the lower the price of the filter becomes.

The customer side AC part 170 includes an AC filter 171 and an AC power transmission line 173.

The AC filter 171 removes frequency components other than the frequency component (for example, 60 Hz) used by the customer part 180, from the AC power generated by the customer side power transformation part 105.

The AC power transmission line 173 transfers the filtered AC power to the customer part 180.

Figure 4:
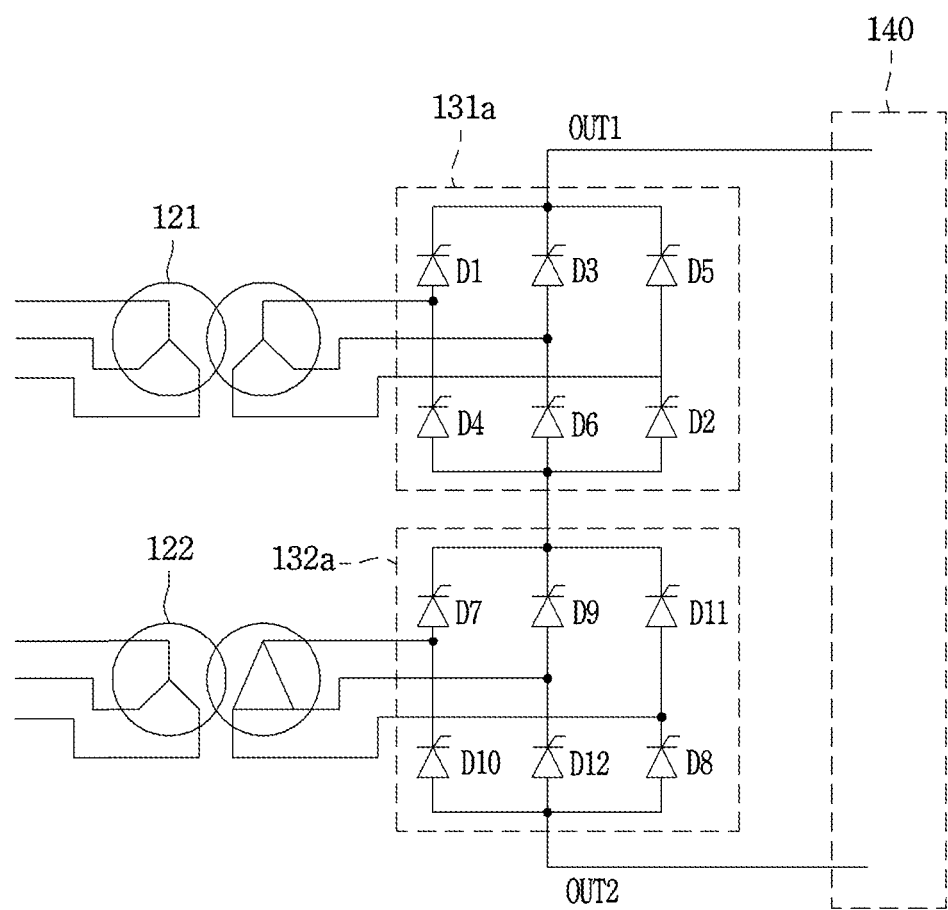
FIG. 4 illustrates a connection between a transformer and a three-phase valve bridge according to an embodiment.

FIG. 4 illustrates a connection between a transformer and a three-phase valve bridge according to an embodiment.

Particularly, FIG. 4 illustrates the connection between the two transformers 121 for the positive pole and the two three-phase valve bridges 131*a* for the positive pole. Since the connection between the two transformers 122 for the negative pole and the two three-phase valve bridges 132*a* for the negative pole, the connection between the two transformers 161 for the positive pole and the two three-phase valve bridges 151*a* for the positive pole, the connection between the two transformers 162 for the negative pole and the two three-phase valve bridges 152*a* for the negative pole, the connection between the one transformer 121 for the positive pole and the one three-phase valve bridge 131*a* for the positive pole, the connection between the one transformer 161 for the positive pole and the one three-phase valve bridge 151*a* for the positive pole, etc., could be easily derived from the embodiment of FIG. 4, drawings and descriptions thereof will not be provided herein.

In FIG. 4, the transformer 121 having the Y-Y connection is referred to as an upper transformer, the transformer 121 having the Y-Δ connection is referred to as a lower transformer, the three-phase valve bridge 131*a* connected to the upper transformer is referred to as upper three-phase valve bridge, and the three-phase valve bridge 131*a* connected to the lower transformer is referred to as lower three-phase valve bridge.

The upper three-phase valve bridge and the lower three-phase valve bridge have two output terminals outputting DC power, i.e., a first output terminal OUT1 and a second output terminal OUT2.

The upper three-phase valve bridge includes six valves D1 to D6, and the lower three-phase valve bridges include six valves D7 to D12.

The valve D1 has a cathode connected to the first output terminal OUT1 and an anode connected to a first terminal of the secondary coil of the upper transformer.

The valve D2 has a cathode connected to the anode of the valve D5 and an anode connected to the anode of the valve D6.

The valve D3 has a cathode connected to the first output terminal OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output terminal OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of the secondary coil of the lower transformer.

The valve D8 has a cathode connected to the anode of the valve D11 and an anode connected to a second output terminal OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output terminal OUT2.

The valve D11 has a cathode connected to the anode of the valve D6 and an anode connected to a third terminal of the secondary coil of the lower transformer.

The valve D12 has a cathode connected to the anode of the valve D9 and an anode connected to the second output terminal OUT2.

Figure 5:
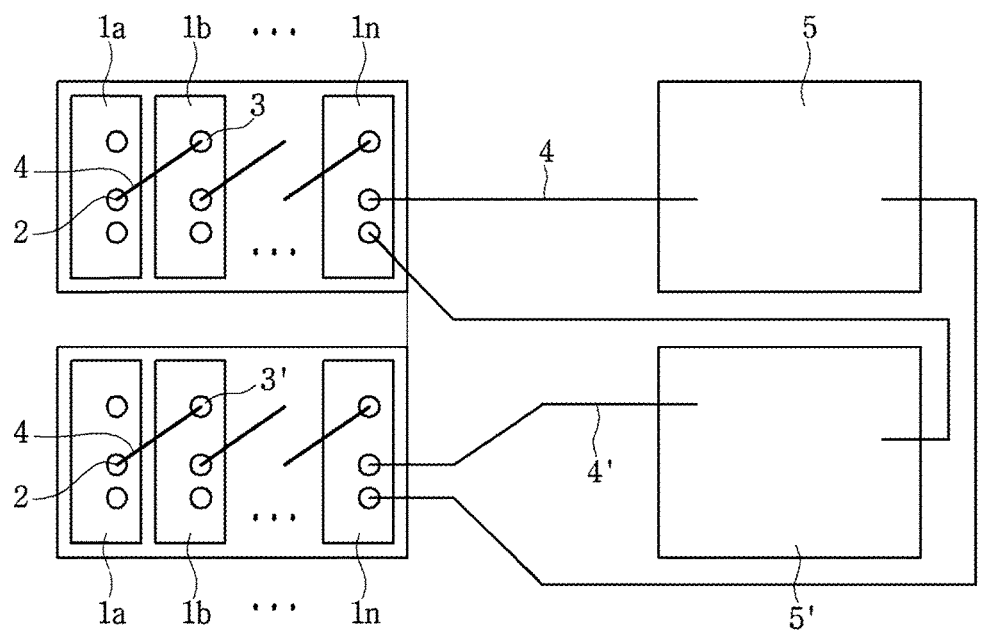
FIG. 5 is a view illustrating a configuration of a data processing device according to an embodiment.

FIG. 5 is a view illustrating a configuration of a data processing device according to an embodiment.

Referring to FIG. 5, a data processing device 200 includes a plurality of preprocessing groups 10*a* to 10*n* and a plurality of controllers 5*a* to 5*n*.

The data processing device 200 may be included in the control part 190 of the high voltage direct current transmission system illustrated in FIG. 1.

Each of the plurality of preprocessing groups 10*a* to 10*n* may include a plurality of preprocessing parts 1*a* to 1*n*. The plurality of preprocessing groups 10*a* to 10*n* may correspond to the plurality of controllers 5*a* to 5*n*, respectively.

An output terminal of each of the plurality of preprocessing parts 1*a* to 1*n* included in the first preprocessing group 10*a* may be connected to an input terminal of the next preprocessing part through an optical waveguide 4. Each of the plurality of preprocessing parts 1*a* to 1*n* may transmit data to the input terminal of the next preprocessing part through the output terminal 2 thereof.

The last preprocessing part 1*n* may be connected to the controller 5*a* through the optical waveguide 4.

The plurality of preprocessing parts 1a to 1n may be connected to various measuring parts (not shown).

Each of the plurality of preprocessing parts 1a to 1n may preprocess and convert the measured values received from the measuring part and then transmit the resultant values to each of the plurality of controllers 5a to 5n.

The first preprocess part 1a preprocesses the measured values received from the measuring part to output a first preprocessed data.

The first preprocessed data output from the output terminal 2 of the first preprocess part 1a is transmitted to an input terminal 3 of the second preprocess part 1b. The first preprocessed data received through the input terminal 3 of the second preprocess part 1b is transmitted to an input terminal of the next preprocessing part together with a second preprocessed data of the second preprocessing part 1b. The preprocessed data transferred from the nth preprocessing part 1n disposed at the end is transferred to the control unit 5.

Each of the plurality of controllers 5a to 5n receives preprocessed data from each of the plurality of preprocessing groups.

Each of the plurality of controllers 5a to 5n may code the received preprocessed data to transmit the coded data to the outside.

Figure 6:
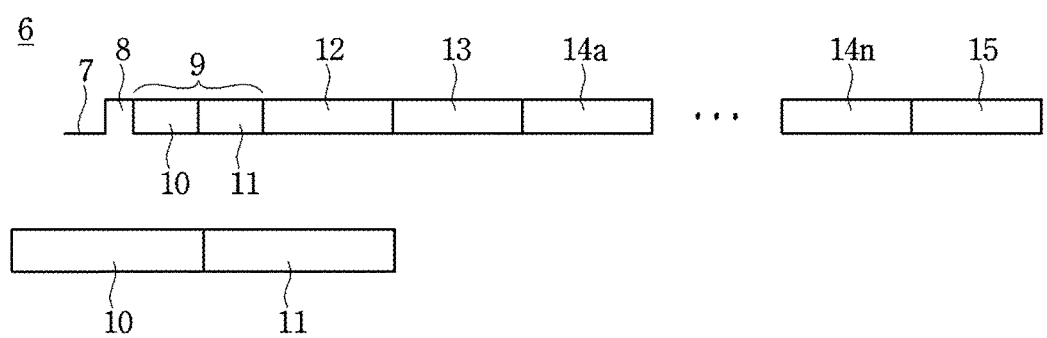
FIG. 6 is a view illustrating timing at which data is transmitted from each of preprocessing parts according to an embodiment.

FIG. 6 is a view illustrating timing at which data is transmitted from each of the preprocessing parts according to an embodiment.

Referring to FIG. 6, a data word 6 starts at a synchronizing signal 7 to which a start bit 8 is attached. A plurality of bit groups 9 to 14n and a check bit group 15 may be disposed next to the start bit 8.

The first bit group 9 may include two bit group elements 10 and 11. Each of the two bit group elements 10 and 11 has a length of 8 bits.

The first bit group element 10 includes a bit sequence identifying each preprocessing part. The second bit group element 11 includes information on the plurality of bit groups 12, 13, 14a to 14n, and 15 following the first bit group 9. The plurality of bit groups 12, 13, 14a to 14n, and 15 correspond to the plurality of measured values, states, and a check bit group.

The second bit group 12 and the third bit group 13 include the states of the measured values received from the measuring part. The information on the states of the measured values may be the information on the states of the measured values generated at the preprocessing part. The information on the states of the measured values may include information on validity of the measured values and information whether the preprocessing operation is performed.

The plurality of bit groups 14a to 14n following the third bit group 13 respectively correspond to the plurality of the measured values generated at the preprocessing part.

The check bit group 15 following the plurality of bit groups 14a to 14n may be used to check whether the data to be transmitted is a reliable data by using the data word 6.

Figure 7:
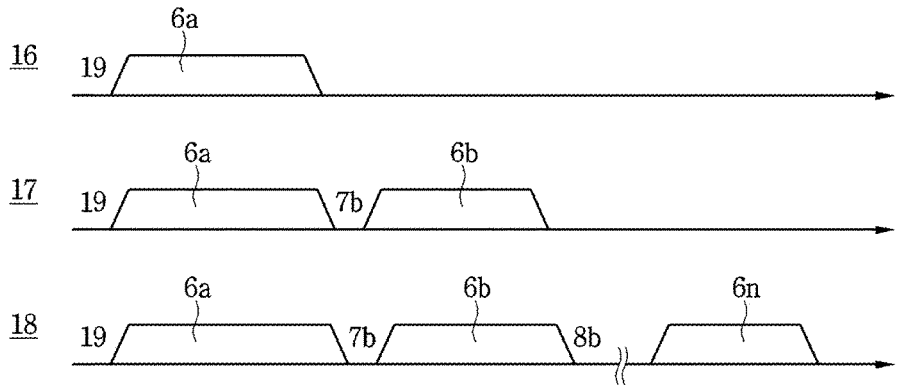
FIG. 7 is a view illustrating data records having a data word from each of the preprocessing parts according to an embodiment.

FIG. 7 is a view illustrating data records having a data word from each of the preprocessing parts according to an embodiment.

Referring to FIG. 7, a plurality of data words 6a to 6n respectively correspond to the data word 6 illustrated in FIG. 6.

A first data record 16 includes the first data word 6a output from the first preprocessing part 1a illustrated in FIG. 5.

A second data record 17 includes the first data word 6a and a second data word 6b output from the second preprocessing part 1b illustrated in FIG. 5.

An nth data record 18 includes data words 6a to 6n output from the plurality of preprocessing parts 1a to 1n.

The first preprocessing part 1a may be used as a master, and may start a data transmission by using a master synchronization signal 19.

The first preprocessing part 1a transmits the first data word 6a having a format as described in FIG. 6, after generating the master synchronization signal 19. As illustrated in FIG. 6, the first data word 6a includes the second bit group element 11 including the information on the number of the plurality of bit groups 12, 13, 14a to 14n, and 15 following the first bit group 9.

The information on the number of the plurality of bit groups 12, 13, 14a to 14n, and 15 may be used to determine an insertion time which indicates a timing at which the second preprocessing part 1b inserts a synchronization signal 7b and the second data word 6b into the next to the first data word 6a. As the insertion time is determined, the second data record 17 may be generated.

Through such a method, each of the subsequent preprocessing parts may generate a data record by inserting a synchronization signal and data words thereof. Finally, an nth data record 18 may be generated.

The data output from the nth preprocessing part 1n may be transferred to the control unit 5 through the optical waveguide 4. The control unit 5 may perform an additional processing process on the data output from the nth preprocessing part 1n.

Figure 8:
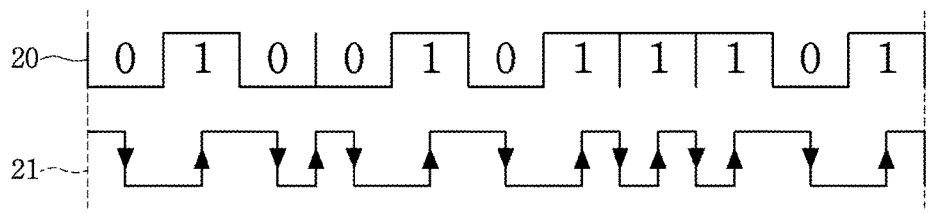
FIG. 8 is a view illustrating a process of coding measured data according to an embodiment.

FIG. 8 is a view illustrating a process of coding the measured data according to an embodiment.

Each of the plurality of controllers illustrated in FIG. 5 may code each of the measured values of each preprocessing part by using a bi-phase coding method.

When using the bi-phase coding method, the measured values may be represented by '0' indicating a low signal and '1' indicating a high signal. The bi-phase coding method does not allow the continuous low state or the high state in one data word.

Referring to FIG. 8, measured data 20 representing a measured value includes low signals and high signals. The controller may code the measured data 20 through the bi-phase coding method, and generate a coded transmission signal 21. The coded transmission signal 21 dies not have a continuous low signal and a continuous high signal. Such a coding method allows a synchronization signal to be clearly shown on the transmission signal 21. In an embodiment, the master synchronization signal 19 generated at the first preprocessing part 1a may be represented such that 13 low signals are continuously shown, and each of synchronization signals 7b to 7n generated from the remaining preprocessing parts except for the first preprocessing part 1a may be represented such that 7 low signals are continuously shown.

Next, FIGS. 9 to 12 will be described.

In FIGS. 9 to 12, the data transmission between each of the components may be performed based on a wavelength division multiplexing (WDM) method. The WDM method is a method in which a plurality of wavelengths are communicated through one optical fiber.

Figure 9:
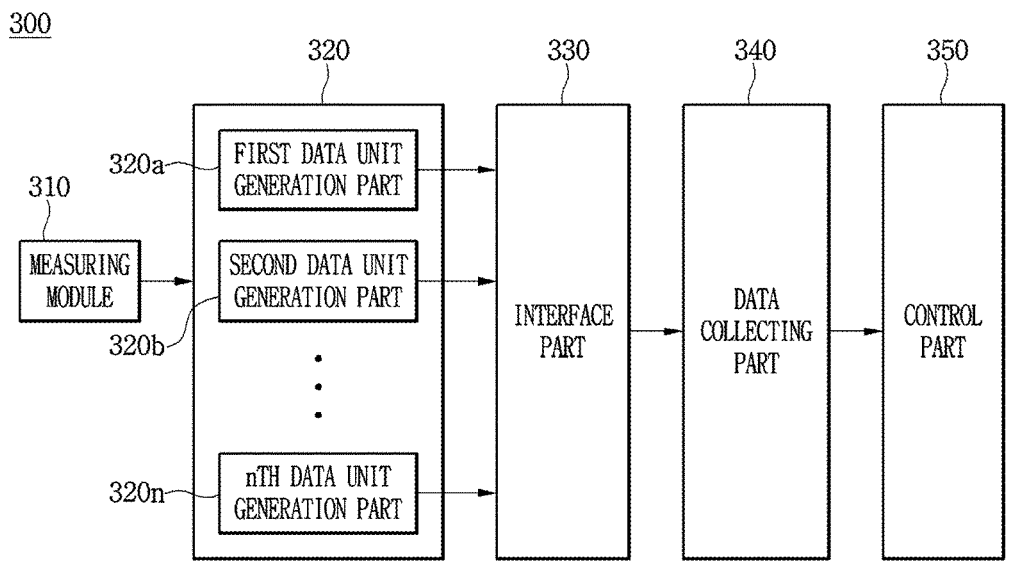
FIG. 9 is a block diagram of a data processing device according to another embodiment.
Figure 10:
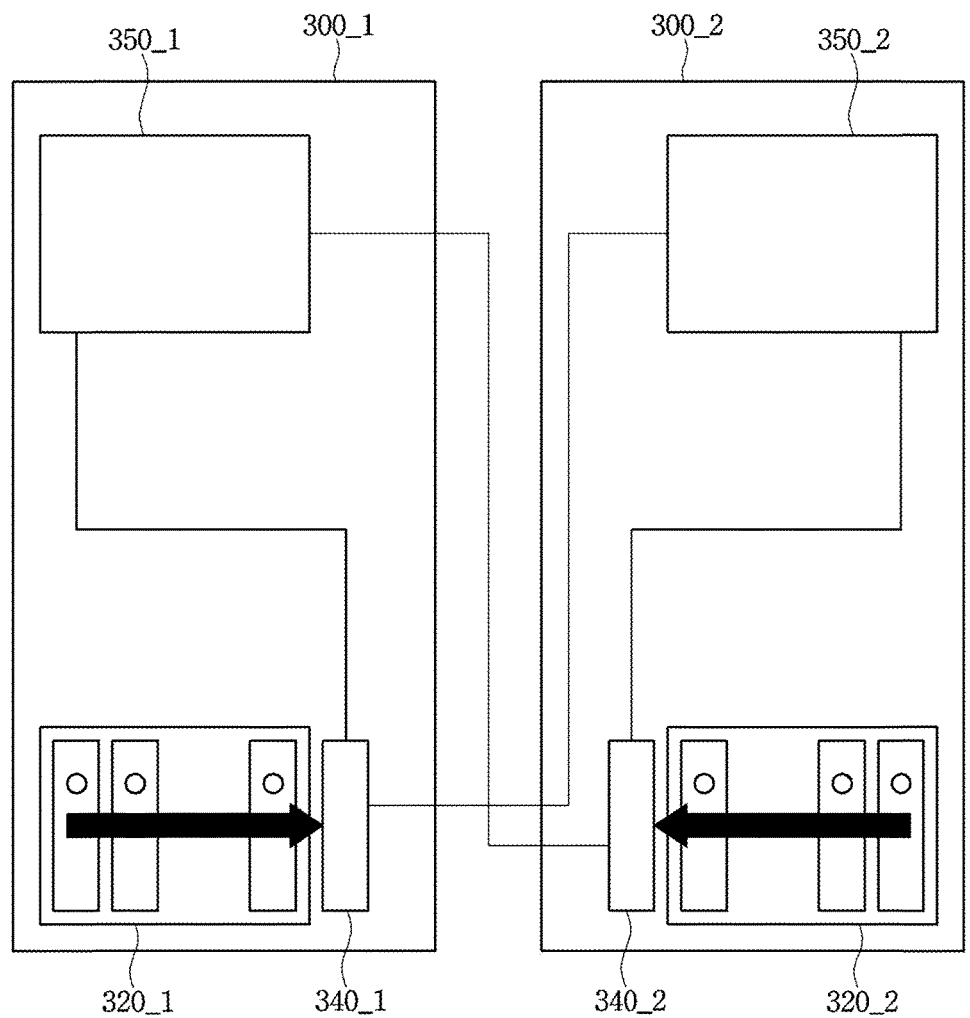
FIG. 10 illustrates a practical configuration of a data processing device according to another embodiment.

FIGS. 9 and 10 are views illustrating a data processing device in a HVDC transmission system according to another embodiment.

FIG. 9 is a block diagram of a data processing device according to another embodiment, and FIG. 10 illustrates a practical configuration of a data processing device according to another embodiment.

The data processing device 300 may be included in the control part 190 illustrated in FIG. 1, but is not limited thereto. Thus, the data processing device 300 may be configured as a separate means.

Referring to FIG. 9, the data processing device 300 includes a measuring module 310, a data power generating part 320, an interface part 330, a data collecting part 340, and a control part 350.

The measuring module 310 acquires measured values at one or more points in the HDVC transmission system. In an embodiment, the measuring module 310 may acquire measured values at one point in the HDVC transmission system illustrated in FIGS. 1 and 2. The measured values may include the AC voltage at a point in the AC part 110 and 170 and the AC current at a point in the AC part 110 and 170. Also, the measured values may include the DC voltage at a point in the DC power transmission part 140 and the DC current at a point in the DC power transmission part 140. However, the measured values, although not necessarily limited thereto, may include the voltage/current of an input terminal or the voltage/current of an output terminal in a component included in the HDVC transmission system.

The data power generating part 320 generates the measured data unit by using the measured values acquired from the measuring module 310. The data power generating part 320 may includes a plurality of data unit generating parts 320a to 320n, and each of the data generation units 320a to 320n may generate the measured data unit by using the measured values acquired from the measuring module 310. Each of the plurality of data unit generating parts 320a to 320n may preprocess the measured data unit received from the measuring module 310. Each of the plurality of data unit generating parts 320a to 320n may perform a preliminary processing operation which removes unnecessary information to allow the control part 350 to extract an effective value of the measured values. Each of the plurality of data unit generating parts 320a to 320n may generate the measured data unit by performing a preprocessing operation.

Each of the plurality of data unit generating parts 320a to 320n may transfer the preprocessed measured data unit to the data collecting part 340 through the interface part 330.

The interface part 330 transfers the plurality of measured data units generated from each of the plurality of data unit generating parts 320a to 320n.

The interface part 330 transfers, in parallel to the data collecting part 340, the plurality of measured data units generated from each of the plurality of data unit generating parts 320a to 320n.

The interface part 330 may transfer the measured data units generated from each of the plurality of data unit generating parts 320a to 320n to the data collecting part 340 by using a backplane bus standard. The interface part 330 may connect the plurality of data unit generating parts 320a to 320n and the data collecting part 340 to each other to function as a path for transferring the measured data units.

The data collecting part 340 collects the plurality of the measured data units transferred through the interface part 330.

In an embodiment, the data collecting part 340 may simultaneously collect the plurality of the measured data units transferred through the interface part 330. That is, the data collecting part 340 may simultaneously collect the plurality of measured data units through the backplane bus standard.

The data collecting part 340 may function as a buffer. That is, the data collecting part 340 may be used as a temporary storage space storing data when the data is transmitted or received between the plurality of data unit generating parts 320a to 320n and the control part 350.

The data collecting part 340 may be referred to as a gate module.

The data collecting part 340 generates the measured data packet based on the collected plurality of measured data units.

In an embodiment, the data collecting part 340 may generate one measured data packet based on the collected plurality of measured data units.

The data collecting part 340 may code the generated measured data packet to generate the coded measured data packet. The data collecting part 340 may code each of the measured data units to generate one measured data packet by using the coded result.

The data collecting part 340 transmits the generated data packet to the control part 350.

The control part 350 provides the received measured data packet to the outside based on a trigger.

The trigger may be a synchronization starting a transmission of the measured data packet.

In an embodiment, the trigger may be generated at predetermined time periods. That is, the control part 350 may provide the received measured data packet to the outside at predetermined time intervals.

In another embodiment, the trigger may be generated at irregular time intervals. The control part 350 may provide the measured data packet to the outside at irregular time intervals.

In another embodiment, the trigger may be a request from other control part. That is, for example, a first controller 350_1 illustrated in FIG. 10 may provide the measured data packet to a second controller 350_2 by the request of the second control part 350_2. Likewise, the second controller 350_2 may provide the measured data packet to the first controller 350_1 by the request of the first controller 350_1.

The first controller 350_1 and the second controller 350_2 may transmit/receive the measured data packet by using an optical cable.

In another embodiment, the trigger may be a request from a user. The control part 350 may provide the measured data packet to a user's terminal according to the request of the user. Here, the user's terminal may be a mobile terminal, such as a computer, a notebook, a smartphone, but is not necessarily limited to thereto.

Referring to FIG. 10, a first data processing device 300_1 and a second data processing device 300_2 are illustrated. The configuration of each of the first data processing device 300_1 and the second data processing device 300_2 is the same as that illustrated in FIG. 9. However, some components are not provided herein.

The first controller 350_1 may transfer the measured data packet of the first data processing device 300_1 to the second controller 350_2 through a second data collecting part 340_2.

The second controller 350_2 may transfer the measured data packet of the second data processing device 300_2 to the first controller 350_1 through the first data collecting part 340_1.

Next, FIG. 11 will be described.

Figure 11:
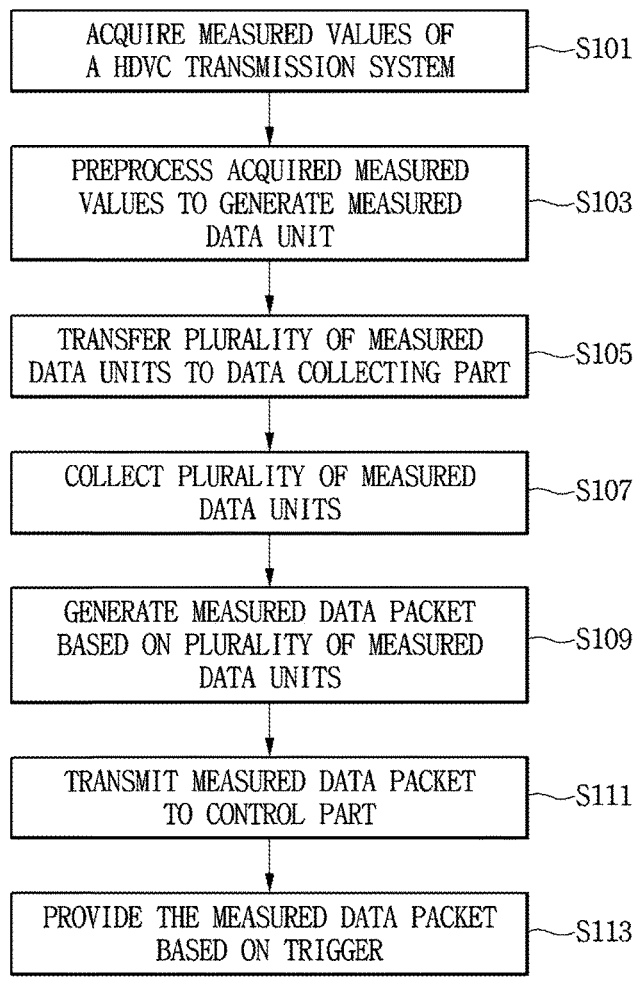
FIG. 11 is a flowchart illustrating an operation method of a data processing device according to an embodiment.

FIG. 11 is a flowchart illustrating an operation method of a data processing device according to an embodiment.

Referring to FIG. 11, the measuring module 310 of the data processing device 300 acquires measured values at one or more point in a HVDC transmission system (S101).

In an embodiment, the measuring module 310 may acquire measured values at one point in the HDVC transmission system illustrated in FIGS. 1 and 2. The measured values may include the AC voltage at a point in the AC part 110 and 170 and the AC current at a point in the AC part 110 and 170. Also, the measured values may include the DC voltage at a point in the DC power transmission part 140 and the DC current at a point in the DC power transmission part 140. However, the measured values are not necessarily limited thereto, and the measured values may include the voltage/current of an input terminal or the voltage/current of an output terminal in a component included in the HDVC transmission system.

The measuring module 310 may include a plurality of measuring parts (not shown). The plurality of measuring parts may transfer the measuring values to a plurality of data unit generating parts 320a to 320n, respectively.

Each of the plurality of data unit generating parts 320a to 320n generates a measured data unit received from the measuring module 310 (S103).

Each of the plurality of data unit generating parts 320a to 320n may preprocess the measured values received from the measuring module 310. Each of the plurality of data unit generating parts 320a to 320n may perform a preliminary processing operation which removes unnecessary information to allow the control part 350 to extract an effective value of the measured values. Each of the plurality of data unit generating parts 320a to 320n may generate a measured data unit by performing a preprocessing operation.

Each of the plurality of data unit generating parts 320a to 320n may transfer the preprocessed measured data unit to a data collecting part 340 through an interface part 330.

The interface part 330 transfers the plurality of measured data units which are respectively generated from the plurality of data unit generating parts 320a to 320n (S105).

The interface part 330 may transfer the measured data units generated from each of the plurality of data unit generating parts 320a to 320n to a data collecting part 340 by using a backplane bus standard. The interface part 330 may connect the plurality of data unit generating parts 320a to 320n and the data collecting part 340 to each other to function as a path for transferring the measured data units.

The interface part 330 may transfer the plurality of measured data units to the data collecting part 340 through an optical cable. That is, the plurality of data unit generating parts 320a to 320n may share an optical cable.

Accordingly, the interface part 330 may transmit, in parallel, the plurality of measured data units through one cable. In this case, the interface part 330 may transfer the plurality of measured data units to the data collecting part 340 by using a wavelength division multiplexing method.

The data collecting part 340 collects the plurality of the measured data units transferred through the interface part 330 (S107).

In an embodiment, the data collecting part 340 may simultaneously collect the plurality of the measured data units transferred through the interface part 330. That is, the data collecting part 340 may simultaneously collect the plurality of measured data units through the backplane bus standard.

The data collecting part 340 may function as a buffer. That is, the data collecting part 340 may be used as a temporary storage space storing data when the data is transmitted or received between the plurality of data unit generating parts 320a to 320n and the control part 350.

The data collecting part 340 may be referred to as a gate module.

The data collecting part 340 generates the measured data packet based on the collected plurality of measured data units (S109).

In an embodiment, the data collecting part 340 may generate one measured data packet based on the collected plurality of measured data units.

The data collecting part 340 may code the generated measured data packet to generate the coded measured data packet. The data collecting part 340 may code each of the measured data units to generate one measured data packet by using the coded result.

The structure of the measured data packet will be described with reference to FIG. 12.

Figure 12:
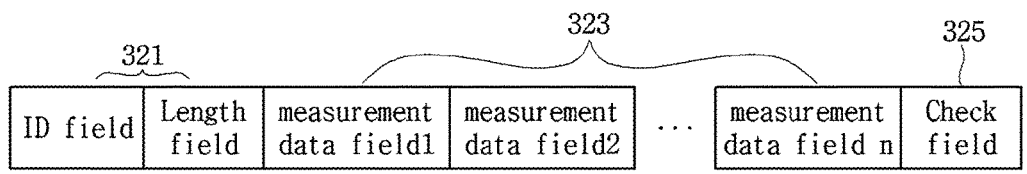
FIG. 12 is a view illustrating a structure of a measured data packet according to an embodiment.

FIG. 12 is a view illustrating a structure of a measured data packet according to an embodiment.

Referring to FIG. 12, the measured data packet may include a header 321, a measured data 323, and a check code 325.

The header 321 includes an identifier field and a length field.

The identifier (ID) field is a field identifying the measured data packet.

The length field is a field representing the length of the measured data 323 and the check code 325 following the header 321.

The header 321 may not include the header of each measured data unit. Each measured data unit may not include a header. Accordingly, the header of the measurement packet may only include information simply representing the measurement packet.

The header 321 is followed by the measured data 323 and the check code 325.

The measured data 323 includes information on the plurality of measured values preprocessed at the data unit generating part. The measured data 323 includes a plurality of measured data fields 1 to n. The plurality of measured data fields correspond to the plurality of the data unit generating parts, respectively. That is, the measured data fields may respectively represent the plurality of measured values received from the plurality of data unit generating parts.

The measured data 323 is followed by the check code 325.

The check code 325 is used to check whether the measured data packet is a reliable data unit. That is, the check code 325 may be used to check an error in the measured data packet. The check code 325 may be a cyclic redundancy check (CRC), but this is only an example.

In the case of the measured data packet as illustrated in FIG. 12, the number of the headers may be reduced in comparison with the embodiment illustrated in FIG. 6. That is, the plurality of data records according to the embodiment of FIG. 6 include a plurality of headers for each preprocessing part. However, since the measured data packet according to the embodiment of FIG. 12 includes only one head, an overhead may be relatively reduced in the embodiment of FIG. 12.

Also, according to an embodiment, since the measured data unit transmitted from the plurality of data unit generation is not transmitted in a time division manner, there is an effect of not being sensitive to transmission synchronization.

Also, according to an embodiment, since the measured data unit transmitted from the plurality of data unit generation is transmitted through one interface, the number of cable wirings may be reduced, and the structure of a system is thus simplified.

FIG. 11 will be described again.

The data collecting part 340 transmits the generated measured data packet to the control part 350 (S111).

In an embodiment, the data collecting part 340 may transmit the measured data packet to the control part 350 by using the wavelength division multiplexing. The wavelength division multiplexing is a method in which a plurality of wavelengths are communicated through one optical fiber.

The control part 350 provides the received measured data packet to the outside based on a trigger (S113).

The trigger may be a synchronization starting a transmission of the measured data packet.

In an embodiment, the trigger may be a time synchronization preset in the data processing device 300. The trigger may be generated at predetermined time periods. That is, the control part 350 may provide the received measured data packet to the outside at predetermined time intervals.

Also, the trigger may be generated at irregular time intervals. The control part 350 may provide the measured data packet to the outside at irregular time intervals.

In another embodiment, the trigger may be a request from other control part. That is, for example, the first controller 350_1 illustrated in FIG. 10 may provide the measured data packet to the second controller 350_2 by the request of the second controller 350_2. Likewise, the second controller 350_2 may provide the measured data packet to the first controller 350_1 by the request of the first controller 350_1.

The first controller 350_1 and second controller 350_2 may transmit/receive the measured data packet by using an optical cable.

In another embodiment, the trigger may be a request from a user. The control part 350 may provide the measured data packet to a user's terminal according to the request of the user. Here, the user's terminal may be a mobile terminal, such as a computer, a notebook, a smartphone, but is not necessarily limited to thereto.

Figure 13:
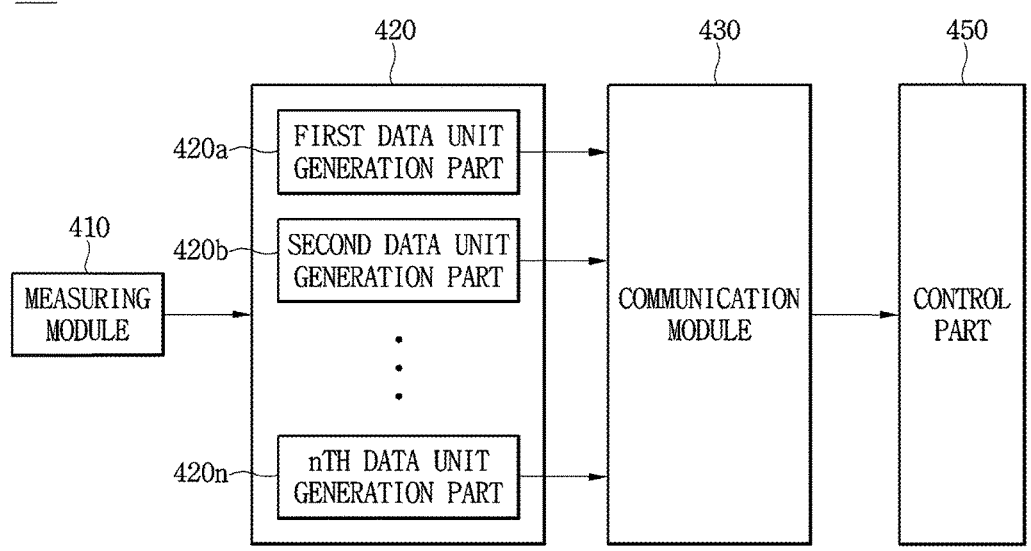
FIG. 13 is a block diagram illustrating a configuration of a data processing device according to another embodiment.

FIG. 13 is a block diagram illustrating a configuration of a data processing device according to another embodiment.

Referring to FIG. 13, the data processing device 400 includes a measuring module 410, a data processing part 420, a communication interface part 430, and a control part 450.

The measuring module 410 acquires measured values at one or more points in the HDVC transmission system. In an embodiment, the measuring module 410 may acquire measured values at one point in the HDVC transmission system illustrated in FIGS. 1 and 2. The measured values may include the AC voltage at a point in the AC part 110 and 170 and the AC current at a point in the AC part 110 and 170. Also, the measured values may include the DC voltage at a point in the DC power transmission part 140 and the DC current at a point in the DC power transmission part 140. However, the measured values, although not necessarily limited thereto, may include the voltage/current of an input terminal or the voltage/current of an output terminal in a component included in the HDVC transmission system.

The data processing part 420 generates the measured data unit by using the measured values acquired from the measuring module 410.

The data processing part 420 may include a plurality of data unit generating parts 420a to 420n, and each of the data generation units 420a to 420n may generate the measured data unit by using the measured values acquired from the measuring module 410. Each of the plurality of data unit generating parts 420a to 420n may preprocess the measured values received from the measuring module 410. Each of the plurality of data unit generating parts 420a to 420n may perform a preliminary processing operation which removes unnecessary information to allow the control part 450 to extract an effective value of the measured values. Each of the plurality of data unit generating parts 420a to 420n may generate a measured data unit by performing a preprocessing operation.

Each of the plurality of data unit generating parts 420a to 420n may transmit the generated measured data unit to the following data unit generating part through the time division multiplexing method.

The communication module 430 may transmit the received measured data unit to the control part 450 through the wavelength division multiplexing method. The communication module 430 may transmit, in parallel, the plurality of measured data units to the control part 450. The communication module 430 may transmit the plurality of measured data units to the control part 450 through the wavelength division multiplexing method. The wavelength division multiplexing method is a method of transmitting data by assigning the data to each of a plurality of wavelength bands through an optical fiber. Since the optical fiber can transmit a great amount of data over a very wide frequency bands, the wavelength division multiplexing method is economical, and has an effect of increasing the speed of transmission.

The wavelength division multiplexing method will be described with reference to FIG. 14.

Figure 14:
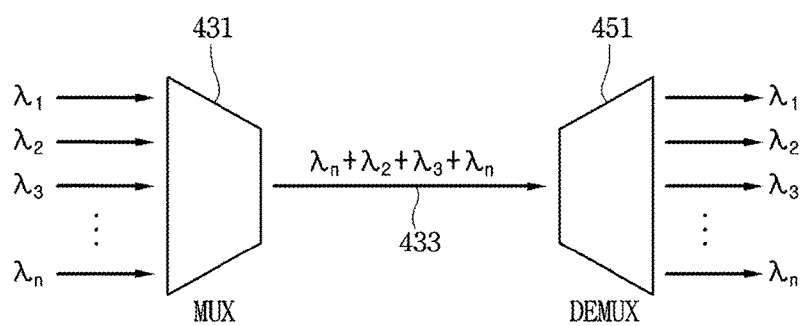
FIG. 14 is a view illustrating a data transmission method through a wavelength division multiplexing method according to embodiments.

FIG. 14 is a view illustrating a data transmission method through a wavelength division multiplexing method according to embodiments.

Referring to FIG. 14, the communication module 430 may include a multiplexing part 431 and an optical fiber 433. In FIG. 14, the optical fiber 433 is illustrated as being included in the communication module 430, but is not necessarily limited thereto. Thus, the optical fiber 433 may be constructed separately from the communication module 430.

The multiplexing part 431 may multiplex the measured data units assigned to a plurality of wavelength bands $\lambda 1$ to $\lambda n$ to output one data.

The optical fiber 433 may transfer the one data output from the multiplexing part 431 to a demultiplexing part 451 of the control part 450.

The demultiplexing part 451 may demultiplex the multiplexed data into a plurality of wavelength bands.

FIG. 13 will be described again.

The communication module 430 may assign each of the measured data units received from the plurality of data unit generating parts 420a to 420n to transmit the measured data unit to the control part 450.

In an embodiment, the communication module 430 may transmit the plurality of measured data units to the control part 450 through an optical fiber. The optical fiber includes a core region and a cladding region surrounding the core region. The core region may include one or more cores.

When the optical fiber includes a plurality of cores, the communication module 430 may assign a measured data unit to each of the plurality of cores to transmit the measured data unit to the control part 450.

Each of the plurality of cores may be assigned with a plurality of wavelength bands. Each of the plurality of cores may also be assigned with a plurality of identical wavelength bands. When one optical fiber includes the plurality of cores, a large amount of data may be transmitted at once.

In an embodiment, the plurality of cores may respectively correspond to the plurality of data unit generation units included in the data processing part 420. Accordingly, the plurality of cores may respectively transmit the measured data unit from the data unit generating parts to the control part 450.

In another embodiment, each of the plurality of cores may correspond to at least two or more data unit generating parts. In this case, the communication module 430 may assign a wavelength band to each of the plurality of cores, and each of the plurality of cores may transmit at least two or more measured data units to the control part 450 through the assigned wavelength band.

The communication part 430 may transmit the measured data unit according to a priority sequence which is given to the plurality of cores. Specifically, when transmission of a measured value measured at one measuring part from among the plurality of the measuring parts are firstly requested, the communication module 430 firstly transmit the measured data unit through the core with the highest priority from among the plurality of cores.

The control part 450 may control the operation of the data processing device 400 overall.

The control part 450 may code the measured data units received from the communication part 430 to provide the coded data units to the outside.

The control part 450 may code the measured data units by using a bi-phase coding method.

Figure 15:
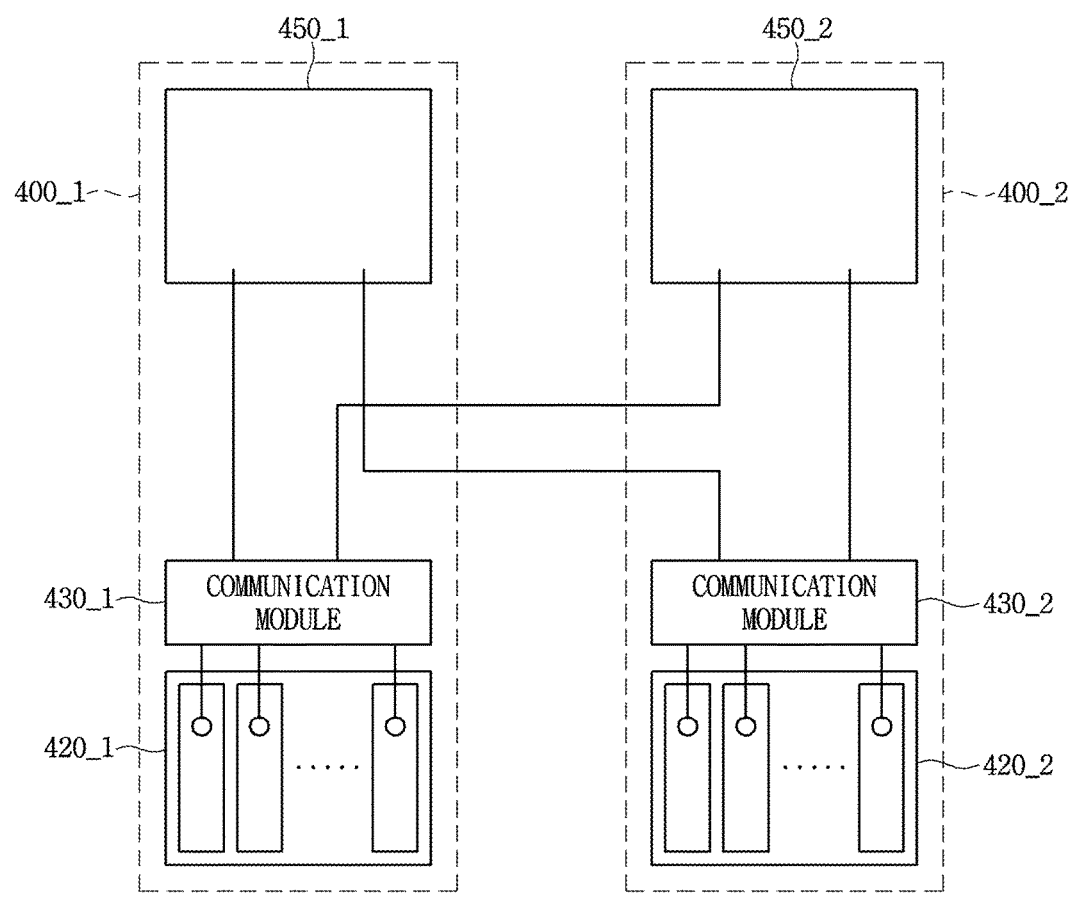
FIG. 15 illustrates an exemplary practical configuration of a data processing device according to another embodiment.

FIG. 15 illustrates an exemplary practical configuration of a data processing device according to another embodiment.

Referring to FIG. 15, a first data processing device 400_1 and a second data processing device 400_2 are illustrated. The configuration of each of the first data processing device 400_1 and the second data processing device 400_2 is the same as that illustrated in FIG. 13. However, some components are not provided herein.

A first data processing part 420_1 transfers a plurality of measured data units to a first communication module 430_1.

The first communication module 430_1 transmits the plurality of received measured data units to a first controller 450_1 by using the wavelength multiplexing method.

A second data processing part 420_2 transfers a plurality of measured data units to a second communication module 430_2.

The second communication module 430_2 transmits the plurality of received measured data units to a second controller 450_2 by using the wavelength multiplexing method.

The first controller 450_1 may receive the measured data units generated by the second data processing part 420_2 from the second communication module 430_2. The wavelength multiplexing method may also be used in this case.

The second controller 450_2 may receive the measured data units generated by the first data processing part 420_1 from the first communication module 430_1. The wavelength multiplexing method may also be used in this case.

Each controller may provide the received measured data units to the outside based on a trigger. The trigger may be a synchronization starting a transmission of the measured data packet.

In an embodiment, the trigger may be a time synchronization preset in the data processing device 400. The trigger may be generated at predetermined time periods. That is, the control part 450 may provide the received measured data packet to the outside at predetermined time intervals.

Also, the trigger may be generated at irregular time intervals. The control part 450 may provide the measured data packet to the outside at irregular time intervals.

In another embodiment, the trigger may be a request from other control part. That is, for example, the first controller 450_1 illustrated in FIG. 15 may provide the measured data packet to a second controller 450_2 by the request of the second controller 450_2. Likewise, the second controller 450_2 may provide the measured data packet to the first controller 450_1 by the request of the first controller 450_1.

The first controller 450_1 and second controller 450_2 may transmit/receive the measured data packet by using an optical cable.

In another embodiment, the trigger may be a request from a user. The control part 450 may provide the measured data packet to a user's terminal according to the request of the user. Here, the user's terminal may be a mobile terminal, such as a computer, a notebook, a smartphone, but is not necessarily limited to thereto.

Figure 16:
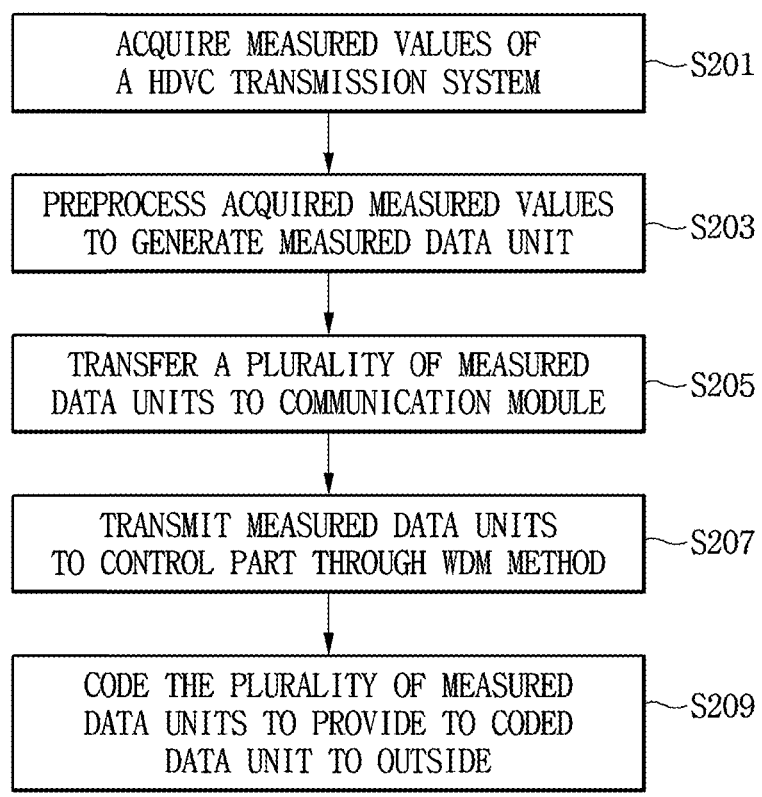
FIG. 16 is a flowchart illustrating a data transmission method of a data processing device according to another embodiment.

FIG. 16 is a flowchart illustrating a data transmission method of a data processing device according to another embodiment.

Referring to FIG. 16, the measuring module 410 of the data processing device 400 acquires measured values at one or more point in a HVDC transmission system (S201).

In an embodiment, the measuring module 410 may acquire measured values at one point in the HDVC transmission system illustrated in FIGS. 1 and 2. The measured values may include the AC voltage at a point in the AC part 110 and 170 and the AC current at a point in the AC part 110 and 170. Also, the measured values may include the DC voltage at a point in the DC power transmission part 140 and the DC current at a point in the DC power transmission part 140. However, the measured values, although not necessarily limited thereto, may include the voltage/current of an input terminal or the voltage/current of an output terminal in a component included in the HDVC transmission system.

The measuring module 410 may include a plurality of measuring parts (not shown). The measuring parts may transfer the measuring values to a plurality of data unit generating parts 420*a* to 420*n*, respectively. That is, the measuring parts may correspond to the plurality of data unit generating parts 420*a* to 420*n*, respectively.

Each of the plurality of data unit generating parts 420*a* to 420*n* generates a measured data unit received from the measuring module 410 (S203).

Each of the plurality of data unit generating parts 420*a* to 420*n* may preprocess the measured values received from the measuring module 410. Each of the plurality of data unit generating parts 420*a* to 420*n* may perform a preliminary processing operation which removes unnecessary information to allow the control part 450 to extract an effective value of the measured values. Each of the plurality of data unit generating parts 420*a* to 420*n* may generate a measured data unit by performing a preprocessing operation.

Each of the plurality of data unit generating parts 420*a* to 420*n* transfers the generated measured data unit to the communication module 430 (S205).

The communication module 430 may transmit the received measured data unit to the control part 450 by using the wavelength division multiplexing method (S207).

The communication module 430 may transmit, in parallel, the plurality of measured data units to the control part 450. The communication module 430 may transmit the plurality of measured data units to the control part 450 by using the wavelength division multiplexing (WDM) method. The wavelength division multiplexing method is a method of transmitting data by assigning the data to each of a plurality of wavelength bands through an optical fiber. Since the optical fiber may transmit a great amount of data over a very wide frequency bands, the wave length division multiplexing method is economical, and has an effect of increasing the speed of transmission.

The communication module 430 may assign each of the measured data units received from the plurality of data unit generating parts 420a to 420n to transmit the measured data unit to the control part 450.

In an embodiment, the communication module 430 may transmit the plurality of measured data units to the control part 450 through an optical fiber. The optical fiber includes a core region and a cladding region surrounding the core region. The core region may include one or more cores.

When the optical fiber includes a plurality of cores, the communication module 430 may assign a measured data unit to each of the plurality of cores to transmit the measured data unit to the control part 450.

Each of the plurality of cores may be assigned with a plurality of wavelength bands. Each of the plurality of cores may also be assigned with a plurality of identical wavelength bands. When one optical fiber includes the plurality of cores, a large amount of data may be transmitted at once.

In an embodiment, the plurality of cores may respectively correspond to the plurality of data unit generation units included in the data power generating part 420. Accordingly, the plurality of cores may respectively transmit the measured data unit from the data unit generating parts to the control part 450.

In another embodiment, each of the plurality of cores may correspond to at least two or more data unit generating parts. In this case, the communication module 430 may assign a wavelength band to each of the plurality of cores, and each of the plurality of cores may transmit at least two or more measured data units to the control part 450 through the assigned wavelength band.

The communication part 430 may transmit the measured data unit according to a priority sequence which is given to the plurality of cores. Specifically, when transmission of a measured value measured at one measuring part from among the plurality of the measuring parts are firstly requested, the communication module 430 firstly transmit the measured data unit through the core with the highest priority from among the plurality of cores.

The time division multiplexing method has a limitation in that as the number of the data unit generating parts increases, the bottleneck ratio of a channel increases and the sensitivity to a transmission synchronization increases. Also, the time division multiplexing method has another limitation in that the requirements of a system may be satisfied only by increasing the speed of data transmission.

However, since the data processing device 400 according to embodiments transmits each measured data unit by assigning the measured data unit to a specific wavelength band, the bottleneck ratio of a channel may be reduced even if the number of the data unit generating parts, and the requirements of a system may be satisfied even without increasing the speed of data transmission.

The control part 450 codes the measured data units received from the communication part 430 to provide the code measured data units to the outside (S209).

According to various exemplary embodiments, even if the measured data unit is transmitted through a time division multiplexing method, an influence sensitive to transmission synchronization may be reduced.

Also, there are effects in that the number of optical cables is reduced, and the structure of a system is simplified.

Also, exemplary embodiments of the present invention may be embodied as computer-readable codes on a computer-readable recording medium. Examples of the computer readable recording medium include read-only memory (ROM), random-access memory (RAM), CD-ROMs, magnetic tapes, floppy disks, optical data storage devices, and carrier waves (such as data transmission through the Internet).

Configurations and methods according to the aforementioned embodiments are not limited thereto, but the aforementioned embodiments may be entirely or partially combined and configured to form various modifications.

What is claimed is:

1. A data processing device of a high voltage direct current (HVDC) transmission system, comprising:
   a plurality of measuring modules configured to measure voltage and current values in the HVDC transmission system;
   a data processing part comprising a plurality of data unit generating parts configured to generate a plurality of measured data units by using the measured values received from the plurality of measuring modules;
   a communication module configured to transmit the plurality of measured data units to outside by using a wavelength division multiplexing method; and
   an optical fiber,
   wherein the plurality of data unit generating parts are configured to transfer the plurality of measured data units to the communication module,
   wherein the communication module is configured to assign a wavelength band to one or more of the plurality of data unit generating parts and transmit the plurality of measured data units in parallel through the optical fiber based on assigned wavelength bands,
   wherein the HVDC transmission system comprises a power generating part, a transmission side alternating current (AC) part, a transmission side power transformation part, a direct current (DC) power transmission part, a customer side power transformation part, a customer side AC part, and a customer part, and
   wherein the data processing device controls at least one of the power generating part, the transmission side AC part, the transmission side power transformation part, the DC power transmission part, the customer side power transformation part, the customer side AC part, and the customer part.

2. The data processing device of an HVDC transmission system according to claim 1, further comprising a control part configured to control the plurality of measured data units to transmit the measured data units to the outside.

3. The data processing device of an HVDC transmission system according to claim 1, wherein each of the plurality of data unit generating parts preprocesses the measured values measured at the measuring part to generate a preprocessed measured data unit.

* * * * *